(12) United States Patent
Shin et al.

(10) Patent No.: US 8,871,566 B2
(45) Date of Patent: Oct. 28, 2014

(54) METHOD OF MANUFACTURING THIN FILM TRANSISTOR

(75) Inventors: Hyun-soo Shin, Suwon-si (KR);
Yeon-gon Mo, Suwon-si (KR);
Jae-kyeong Jeong, Suwon-si (KR);
Jin-seong Park, Suwon-si (KR);
Hun-jung Lee, Suwon-si (KR);
Jong-han Jeong, Suwon-si (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 335 days.

(21) Appl. No.: 13/289,883

(22) Filed: Nov. 4, 2011

(65) Prior Publication Data

US 2012/0052636 A1 Mar. 1, 2012

Related U.S. Application Data

(62) Division of application No. 12/155,106, filed on May 29, 2008, now Pat. No. 8,053,773.

(30) Foreign Application Priority Data

May 29, 2007 (KR) ........................ 10-2007-0051994

(51) Int. Cl.
*H01L 21/336* (2006.01)
*G02F 1/1368* (2006.01)
*H01L 29/66* (2006.01)
*H01L 29/786* (2006.01)
*H01L 27/12* (2006.01)

(52) U.S. Cl.
CPC ........ *H01L 29/78606* (2013.01); *G02F 1/1368* (2013.01); *H01L 29/66742* (2013.01); *G02F 2201/501* (2013.01); *G02F 2202/10* (2013.01); *H01L 27/12* (2013.01); *H01L 29/7869* (2013.01)

USPC .............. 438/104; 438/151; 438/522; 257/43

(58) Field of Classification Search
USPC ........................................................ 438/104
See application file for complete search history.

(56) References Cited

U.S. PATENT DOCUMENTS 5,576,229 A 11/1996 Murata et al.
5,693,961 A 12/1997 Hamada
(Continued)

FOREIGN PATENT DOCUMENTS

JP 2002-289854 A 10/2002
JP 2004-2733614 A 9/2004
(Continued)

OTHER PUBLICATIONS

Myong, Seung Yeop, et al., "Role of Intentionally Incorporated Hydrogen in Wide-Band-Gap ZnO Thin Film Prepared by Photo-MOCVD Technique," Physics of Semiconductors, 27$^{th}$ International Conference on the Physics of Semiconductors, American Institute of Physics Conf. Proc., pp. 195-196 (Jun. 30, 2005).

*Primary Examiner* — Robert Carpenter
(74) *Attorney, Agent, or Firm* — Lee & Morse, P.C.

(57) ABSTRACT

A thin film transistor includes a gate electrode, a first insulating layer on the gate electrode, a semiconductor layer on the gate electrode and separated from the gate electrode by the first insulating layer, the semiconductor layer including a channel region corresponding to the gate electrode, a source region, and a drain region, a hydrogen diffusion barrier layer on the semiconductor layer, the hydrogen diffusion barrier layer covering the channel region and exposing the source and drain regions, and a second insulation layer on the source and drain regions and on the hydrogen diffusion barrier layer, such that the hydrogen diffusion barrier layer is between the second insulation layer and the channel region.

14 Claims, 5 Drawing Sheets

(56) References Cited

U.S. PATENT DOCUMENTS

| | | |
|---|---|---|
| 5,747,830 A | 5/1998 | Okita |
| 5,866,946 A | 2/1999 | Kamigaki et al. |
| 6,150,692 A | 11/2000 | Iwanaga et al. |
| 6,746,905 B1 | 6/2004 | Fukuda |
| 7,064,374 B2 | 6/2006 | Solayappan et al. |
| 8,003,981 B2 * | 8/2011 | Iwasaki et al. .......... 257/43 |
| 2002/0125573 A1 | 9/2002 | Cuchiaro et al. |
| 2002/0127867 A1 | 9/2002 | Lee |
| 2005/0280123 A1 | 12/2005 | Lee |
| 2006/0091474 A1 | 5/2006 | Nabatame et al. |
| 2007/0069209 A1 | 3/2007 | Jeong et al. |
| 2007/0298549 A1 | 12/2007 | Jurczak et al. |
| 2009/0065771 A1 | 3/2009 | Iwasaki et al. |

FOREIGN PATENT DOCUMENTS

| | | |
|---|---|---|
| KR | 10-2002-0014201 A | 2/2002 |
| KR | 10-2002-0060844 A | 7/2002 |
| KR | 10-0352885 B1 | 9/2002 |
| KR | 10-0508023 B1 | 8/2005 |

* cited by examiner

METHOD OF MANUFACTURING THIN FILM TRANSISTOR

CROSS REFERENCE TO RELATED APPLICATION

This is a divisional application based on application Ser. No. 12/155,106, filed May 29, 2008, now U.S. Pat. No. 8,053,773 the entire contents of which is hereby incorporated by reference.

BACKGROUND OF THE INVENTION

1. Field of the Invention

Embodiments relate to a thin film transistor, a flat panel display device having the same, and associated methods.

2. Description of the Related Art

In general, a thin film transistor ("TFT") includes a semiconductor layer and a gate electrode. The semiconductor layer includes a channel region, a source region, and a drain region. The gate electrode corresponds to the channel region of the semiconductor layer and is electrically insulated therefrom. The semiconductor layer may be formed of amorphous silicon or polysilicon. When the semiconductor layer is formed of amorphous silicon, the mobility may be low. Accordingly, it may be difficult to employ such TFT's in high speed circuits. In contrast, polysilicon may provide high mobility. The threshold voltage of TFT's formed from polysilicon may be non-uniform, however, and thus an additional compensating circuit may be required. Moreover, manufacturing a TFT using low temperature polysilicon (LTPS) may require expensive processes such as laser annealing, and it may be difficult to control operational characteristics for large area substrates.

In view of the difficulties in advancing amorphous silicon and polysilicon TFT technologies, research into the use of compound semiconductors has been increasing. In particular, compound semiconductors formed of zinc oxide (ZnO), or including zinc oxide in combination with other materials, e.g., dopants, have been of interest. However, TFT's including compound semiconductors may exhibit relatively high resistivities, e.g., $1\times10^4$ to $1\times10^6 \Omega \cdot$cm. Accordingly, there may be a high contact resistance where metal electrodes contact source and drain regions formed from the compound semiconductor. Implanting hydrogen (H) atoms into the compound semiconductor may reduce the resistivity the semiconductor layer and reduce the contact resistance, but hydrogen in the channel region may increase leakage current.

SUMMARY OF THE INVENTION

Embodiments are therefore directed to a TFT, a flat panel display device having the same, and associated methods, which substantially overcome one or more of the problems due to the limitations and disadvantages of the related art.

It is therefore a feature of an embodiment to provide a TFT having hydrogen in source and drain regions, and having a hydrogen diffusion barrier layer disposed on a channel region.

It is therefore another feature of an embodiment to provide a flat panel display device having TFT's formed of a compound semiconductor.

It is therefore another feature of an embodiment to provide a method of selectively diffusing hydrogen from a hydrogen-containing layer into source and drain regions of a TFT, while minimizing the diffusion of hydrogen into the channel region of the TFT.

At least one of the above and other features and advantages may be realized by providing a thin film transistor, including a gate electrode, a first insulating layer on the gate electrode, a semiconductor layer on the gate electrode and separated from the gate electrode by the first insulating layer, the semiconductor layer including a channel region corresponding to the gate electrode, a source region, and a drain region, a hydrogen diffusion barrier layer on the semiconductor layer, the hydrogen diffusion barrier layer covering the channel region and exposing the source and drain regions, and a second insulation layer on the source and drain regions and on the hydrogen diffusion barrier layer, such that the hydrogen diffusion barrier layer is between the second insulation layer and the channel region.

A concentration of hydrogen atoms in the source and drain regions may be larger than a concentration of hydrogen atoms in the channel region. The second insulation layer may contain hydrogen atoms. The semiconductor layer may include an oxygen-containing compound semiconductor. The oxygen-containing compound semiconductor may be zinc oxide. The oxygen-containing compound semiconductor may include zinc oxide doped with one or more of gallium, indium, or tin.

The hydrogen diffusion barrier layer may include one or more of a nitride, a carbide, or a ternary compound having a metal as a component thereof. The hydrogen diffusion barrier layer includes one or more of titanium nitride, tantalum nitride, tungsten nitride, titanium carbide, tantalum carbide, a ternary compound of titanium, silicon, and nitrogen, a ternary compound of tantalum, silicon, and nitrogen, or a ternary compound of tungsten, boron, and nitrogen.

At least one of the above and other features and advantages may also be realized by providing a flat panel display device, including an image display panel having pixels and thin film transistors coupled to the pixels. The thin film transistors may include a gate electrode, a first insulating layer on the gate electrode, a semiconductor layer on the gate electrode and separated from the gate electrode by the first insulating layer, the semiconductor layer including a channel region corresponding to the gate electrode, a source region, and a drain region, a hydrogen diffusion barrier layer on the semiconductor layer, the hydrogen diffusion barrier layer covering the channel region and exposing the source and drain regions, and a second insulation layer on the source and drain regions and on the hydrogen diffusion barrier layer, such that the hydrogen diffusion barrier layer is between the second insulation layer and the channel region.

The image display panel may include a first substrate that includes the pixels and the thin film transistors coupled to the pixels, the pixels having a first electrode coupled to a corresponding thin film transistor, a second substrate having second electrodes corresponding to the pixels, and a liquid crystal layer between the first and second substrates. The image display panel may include a substrate having the thin film transistors formed thereon, and organic light emitting diodes corresponding to the pixels formed on the substrate. The organic light emitting diodes may be coupled to the thin film transistors.

A concentration of hydrogen atoms in the source and drain regions may be larger than a concentration of hydrogen atoms in the channel region. The second insulation layer may contain hydrogen atoms. The semiconductor layer may include an oxygen-containing compound semiconductor. The hydrogen diffusion barrier layer may include one or more of a nitride, a carbide, or a ternary compound having a metal as a component thereof.

At least one of the above and other features and advantages may also be realized by providing a method of manufacturing a thin film transistor, including forming a semiconductor layer having a portion overlying a gate electrode and having extending portions that extend laterally beyond the gate electrode, the gate electrode being insulated from the semiconductor layer, forming a hydrogen diffusion barrier layer on the portion of the semiconductor layer that overlies the gate electrode, the hydrogen diffusion barrier layer exposing the extending portions of the semiconductor layer, forming a hydrogen-containing layer on the portion of the semiconductor layer that overlies the gate electrode and on the extending portions of the semiconductor layer, and processing the hydrogen-containing layer to diffuse hydrogen from the hydrogen-containing layer into the extending portions of the semiconductor layer.

The hydrogen-containing layer may be an insulating layer having contact holes that expose the extending portions of the semiconductor layer, and the contact holes may be formed in the insulating layer after the insulating layer is processed to diffuse hydrogen into the extending portions of the semiconductor layer. Processing the hydrogen-containing layer to diffuse hydrogen from the hydrogen-containing layer into the extending portions of the semiconductor layer may result in a concentration of hydrogen atoms in the extending portions that is larger than a concentration of hydrogen atoms in the portion overlying the gate electrode.

The semiconductor layer may include an oxygen-containing compound semiconductor. The hydrogen diffusion barrier layer may include one or more of a nitride, a carbide, or a ternary compound having a metal as a component thereof. Processing the hydrogen-containing layer to diffuse hydrogen from the hydrogen-containing layer into the extending portions of the semiconductor layer may include heat treating.

BRIEF DESCRIPTION OF THE DRAWINGS

The above and other features and advantages will become more apparent to those of ordinary skill in the art by describing in detail example embodiments with reference to the attached drawings, in which.

DETAILED DESCRIPTION OF THE INVENTION

Korean Patent Application No. 10-2007-0051994, filed on May 29, 2007, in the Korean Intellectual Property Office, and entitled: "Thin Film Transistor, Method of Manufacturing Thin Film Transistor, Flat Panel Display Device Having Thin Film Transistor" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a carbide" may represent a single compound, e.g., titanium carbide, or multiple compounds in combination, e.g., titanium carbide mixed with tantalum carbide.

In the figures, the dimensions of layers and regions may be exaggerated for clarity of illustration. Where an element is described as being coupled to a second element, the element may be directly coupled to second element, or may be indirectly coupled to second element via one or more other elements. Further, where an element is described as being coupled to a second element, it will be understood that the elements may be electrically coupled, e.g., in the case of transistors, capacitors, power supplies, nodes, etc. In the drawings, elements may be omitted for clarity. Like reference numerals refer to like elements throughout.

Figure 1:
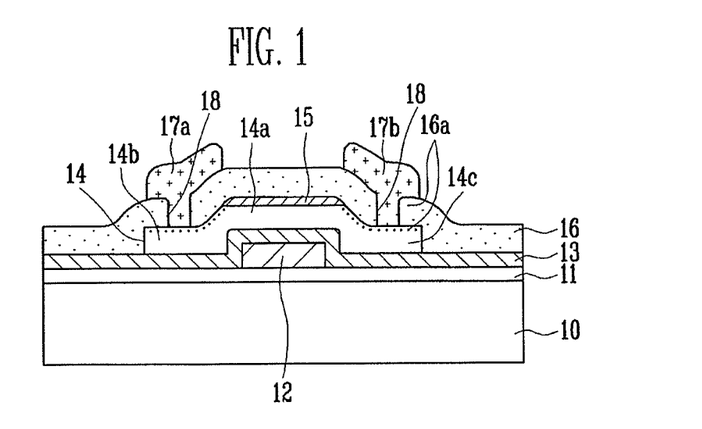
FIG. 1 illustrates a cross-sectional view of a TFT according to a first embodiment.

FIG. 1 illustrates a cross-sectional view of a TFT according to a first embodiment. Referring to FIG. 1, the TFT may be disposed on a substrate 10. The substrate 10 may have an insulating buffer layer 11 thereon. A gate electrode 12 may be on the buffer layer 11. A semiconductor layer 14 may extend across the gate electrode 12, the semiconductor layer 14 being insulated from the gate electrode 12 by a gate insulating layer 13. The semiconductor layer 14 may include a channel region 14a, a source region 14b, and a drain region 14c.

A hydrogen diffusion barrier layer 15 may be on the channel region 14a of the semiconductor layer 14. An interlayer dielectric layer 16 may extend across the hydrogen diffusion barrier layer 15 and the semiconductor layer 14. The hydrogen diffusion barrier layer 15 may cover the channel region 14a, such that the hydrogen diffusion barrier layer 15 is between the channel region 14a and the interlayer dielectric layer 16. The hydrogen diffusion barrier layer 15 may expose the source and drain regions 14b and 14c.

Contact holes 18 may penetrate the interlayer dielectric layer 16. Source and drain electrodes 17a and 17b may be formed on the interlayer dielectric layer 16 so as to be coupled to exposed portions of the source and drain regions 14b and 14c through the contact holes 18.

In an implementation, the semiconductor layer 14 may be predominantly or completely formed from an oxygen-containing compound semiconductor. The compound semiconductor may include, e.g., zinc oxide, which may be doped with one or more elements such as gallium (Ga), indium (In), or tin (Sn) as a main component. The interlayer dielectric layer 16 may include hydrogen atoms 16a and may be formed of, e.g., a nitride such as silicon nitride ($SiN_x$). The source and drain regions 14b and 14c may also have portions that contain hydrogen atoms 16a. The hydrogen atoms 16a in the source and drain regions 14b and 14c may be diffused from the hydrogen-containing interlayer dielectric layer 16, as described in greater detail below.

In an implementation, the hydrogen-containing portions of the source and drain regions 14b and 14c may correspond to an interface with the interlayer dielectric layer 16. The contact holes 18 may penetrate the interlayer dielectric layer 16 at the hydrogen-containing portions of the source and drain regions 14b and 14c, and the source and drain electrodes 17a and 17b may be coupled to the source and drain regions 14b and 14c through the contact holes 18. The hydrogen atoms 16A may penetrate into surfaces of the source and drain regions 14b and 14c from the overlying interlayer dielectric layer 16 and may act as a shallow donor. Accordingly, the conductivity of the source and drain regions 14b and 14c may be improved, i.e., the resistivity may be reduced. The reduction in the resistivity of the semiconductor layer due to the presence of hydrogen is described in a journal article entitled "*Role of Intentionally Incorporated Hydrogen in Wide-Band-Gap ZnO Thin Film Prepared by Photo-MOCVD Technique*," Vol. 772, Physics of Semiconductors: 27th International Conference on the Physics of Semiconductors.

The hydrogen diffusion barrier layer 15 may include one or more of a nitride, a carbide, or ternary compound that includes a metal as one of the three components. The hydrogen diffusion barrier layer 15 may include, e.g., one or more of titanium nitride (TiN), tantalum nitride (TaN), tungsten nitride (WN), titanium carbide (TiC), tantalum carbide (TaC), a ternary compound of titanium, silicon, and nitrogen (TiSiN), a ternary compound of tantalum, silicon, and nitrogen (TaSiN), or a ternary compound of tungsten, boron, and nitrogen (WBN).

The hydrogen diffusion barrier layer 15 may prevent hydrogen atoms 16a from diffusing from the interlayer dielectric layer 16 into the channel region 14a, such that the resistivity of the channel region 14 may be unchanged, or may change by an insignificant amount. Thus, the concentration of hydrogen atoms 16a in the source and drain regions 14b and 14c may be larger than the concentration of hydrogen atoms 16a in the channel region 14a. Reducing the resistivity of the source and drain regions 14b and 14c, as afforded by the hydrogen atoms contained in the source and drain regions 14b and 14c, may improve the electrical characteristics of the TFT device by reducing contact resistance between the source and drain regions 14b and 14c and corresponding source and drain electrodes 17a and 17b. At the same time, reducing or eliminating the introduction of hydrogen atoms 16a into the channel region 14a may prevent increases in leakage current in the channel region 14a.

Figure 2A:
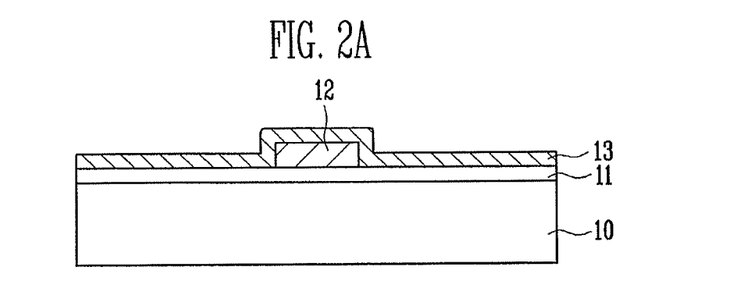
FIGS. 2A-2D illustrate cross-sectional views of stages in a method of manufacturing a TFT according to the first embodiment.

FIGS. 2A-2D illustrate cross-sectional views of stages in a method of manufacturing a thin film transistor according to the first embodiment. With reference to FIG. 2A, after the gate electrode 12 is formed on a substrate 10, e.g., insulating substrate, a gate insulating layer 13 may be formed on the substrate 10 and on the gate electrode 12. The gate insulating layer 13 may contain little or no hydrogen. In an implementation, prior to a formation of the gate electrode 12, the buffer layer 11 may be formed from an insulator, e.g., an insulator having little or no hydrogen.

Figure 2B:
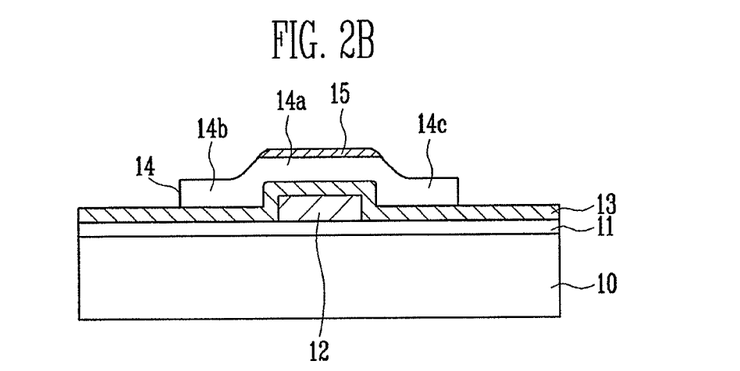

Referring to FIG. 2B, a semiconductor layer 14 for providing a channel region 14a, a source region 14b, and a drain region 14c may be formed on a gate insulating layer 13 that covers the gate electrode 12. The semiconductor layer 14 may extend across a portion of the substrate 10 so as to cover the gate electrode 12 and extend laterally away from the gate electrode 12 on opposite sides of the gate electrode 12. A hydrogen diffusion barrier layer 15 may be formed on the channel region 14a of the semiconductor layer 14. The hydrogen diffusion barrier layer 15 may have a thickness of, e.g., 20 nm to 0.5 μm, and may be confined to the channel region 14a, i.e., it may be over the gate electrode 12 while exposing some or all of the source and drain regions 14b and 14c on opposite sides of the gate electrode 14.

Figure 2C:
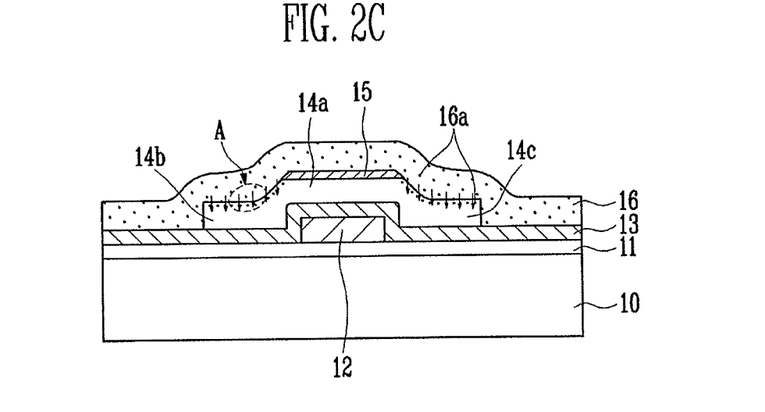

With reference to FIG. 2C, the interlayer dielectric layer 16 may be formed on the semiconductor layer 14 so as to cover some or all of the source and drain regions 14b and 14c. The interlayer dielectric layer 16 may cover the channel regions 14a, and the hydrogen diffusion barrier 15 may be disposed between the channel region 14a and the interlayer dielectric layer 16. The interlayer dielectric layer 16 may be formed of, e.g., silicon nitride such as silicon oxy nitride (SiON), and may contain hydrogen.

Subsequently, in order to diffuse the hydrogen atoms 16a from the interlayer dielectric layer 16 into the source and drain regions 14b and 14c, a thermal treatment may be performed. For example, the thermal treatment may be performed at a temperature of about 300° C. for about 1 hour or more. The hydrogen atoms 16a contained in the interlayer dielectric layer 16 may diffuse into the source and drain regions 14b and 14c through an interface A, as illustrated in FIG. 2C. The hydrogen diffused into the source and drain regions 14b and 14c may reduce the resistivity, i.e., improve the conductivity, of the source and drain regions 14b and 14c. Due to the hydrogen diffusion barrier layer 15, however, the hydrogen atoms 16a may be substantially prevented from diffusing to the channel region 14a. Accordingly, the resistivity of the channel region 14a may be unchanged, or may change by an insignificant amount.

Figure 2D:
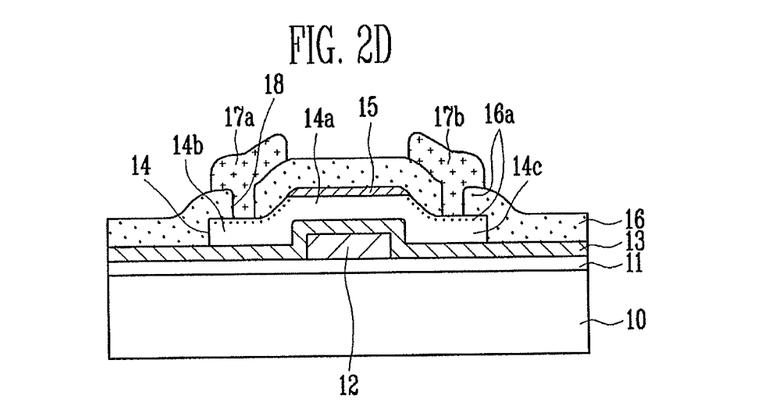

With reference to FIG. 2D, contact holes 18 may be formed in the interlayer dielectric layer 16 so as to expose portions of the source and drain regions 14b and 14c that include hydrogen, i.e., regions having a relatively high concentration of hydrogen as a result of the diffusion thereof from the interlayer dielectric layer 16. The source and drain electrodes 17a and 17b may be formed on the interlayer dielectric layer 16, and may be coupled to the respective source and drain regions 14b and 14c through the contact holes 18.

As described above, the hydrogen diffusion barrier layer 15 may be formed on the channel region 14a of the semiconductor layer 14. Accordingly, while the hydrogen atoms 16a contained in the interlayer dielectric layer 16 may be diffused into the source and drain regions 14b and 14c, the hydrogen diffusion barrier layer 15 may substantially prevent the hydrogen atoms 16a from penetrating into the channel region 14a. Further, in an implementation, the buffer layer 11 and the gate insulating layer 13 may be formed of materials that do not contain hydrogen atoms, so as to avoid providing hydrogen atoms that could penetrate into the channel region 14a.

Figure 3:
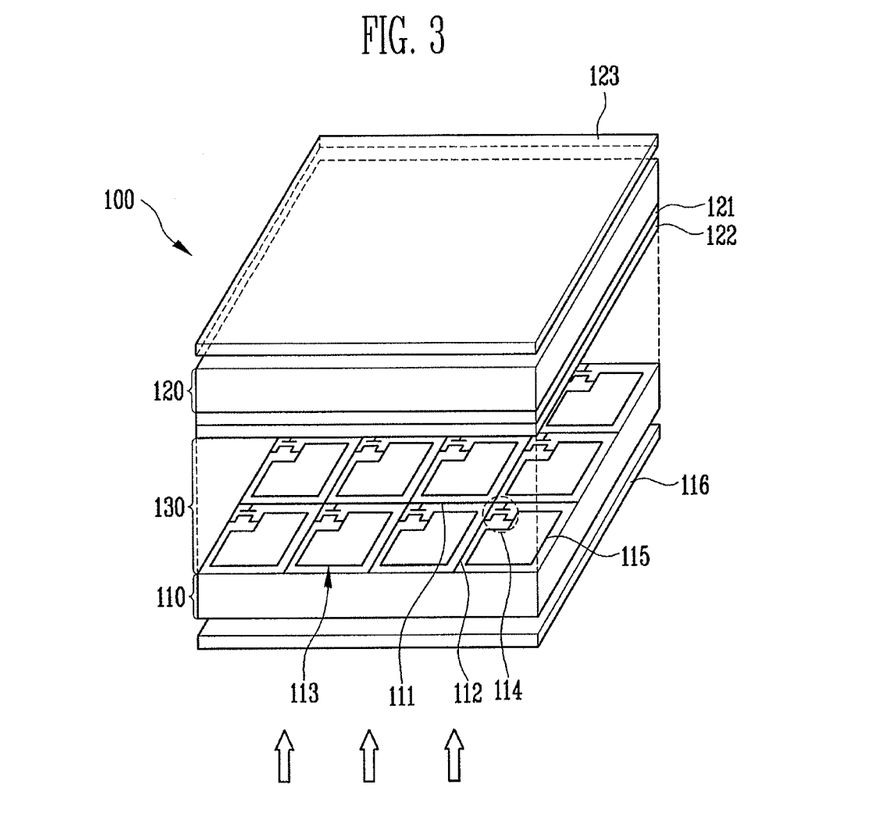
FIG. 3 illustrates a perspective view of a flat panel display device according to a second embodiment.

FIG. 3 illustrates a perspective view of a flat panel display device according to a second embodiment. The flat panel display device may include a display panel 100 for displaying images as a main element thereof. The display panel 100 may includes two substrates 110 and 120, and a liquid crystal layer 130. The two substrates 110 and 120 may be disposed opposite to each other, and the liquid crystal layer 130 may be interposed between the two substrates 110 and 120. A pixel region 113 may be defined by a plurality of gate lines 111 and a plurality of data lines 112, which may be arranged in a matrix. TFT's 114 and pixel electrodes 115 may be formed on the substrate 110 at the intersections of the gate lines 111 and the data lines 112. The TFT's 114 may controls signals supplied to respective pixels. The pixel electrodes 115 may be coupled to corresponding TFT's 114.

The TFT's 114 may be constructed as described above in connection with FIG. 1, and may be fabricated by the method described in connection with FIGS. 2A-2D. In particular, referring to FIGS. 1 and 3, the TFT's 114 may be formed on the substrate 110, which may be an insulating substrate. As described above, in an implementation, the buffer layer 11 may be provided under the TFT's. The TFT's may each include the gate electrode 12, the semiconductor layer 14, the hydrogen diffusion barrier layer 15, the interlayer dielectric layer 16, and the source and drain electrodes 17a and 17b. The gate electrode 12 may be formed on the substrate 110. The semiconductor layer 14 may be insulated from the gate electrode 12 by the gate insulation layer 13, and may provide the channel region 14a, as well as the source and drain regions 14b and 14c. The hydrogen diffusion barrier layer 15 may be formed on the channel region 14a of the semiconductor layer 14. The interlayer dielectric layer 16 may contain hydrogen atoms 16a, and contact holes 18 may be formed in the interlayer dielectric layer 16 to expose the source and drain regions 14b and 14c. The source and drain electrodes 17a and 17b may be coupled to the source and drain regions 14b and 14c through the contact holes 18. The source and drain regions 14b and 14c may include hydrogen atoms 16a, which may be diffused from the interlayer dielectric layer 16.

Referring again to FIG. 3, a color filter 121 and a common electrode 122 may be formed on the substrate 120. First and second polarizers 116 and 123 may be formed on rear surfaces of the substrates 110 and 120, respectively. A back light (not shown) may be disposed at a lower portion of the first polarizer 116 as a light source. One or more LCD driver IC's (not shown) may be mounted around the pixel region 113 of the display panel 100 and may function to drive the display panel 100. The LCD driver may convert an external electric signal into a scan signal and a data signal, and provide the scan and data signals to gate lines 111 and data lines 112, respectively.

Figure 4A:
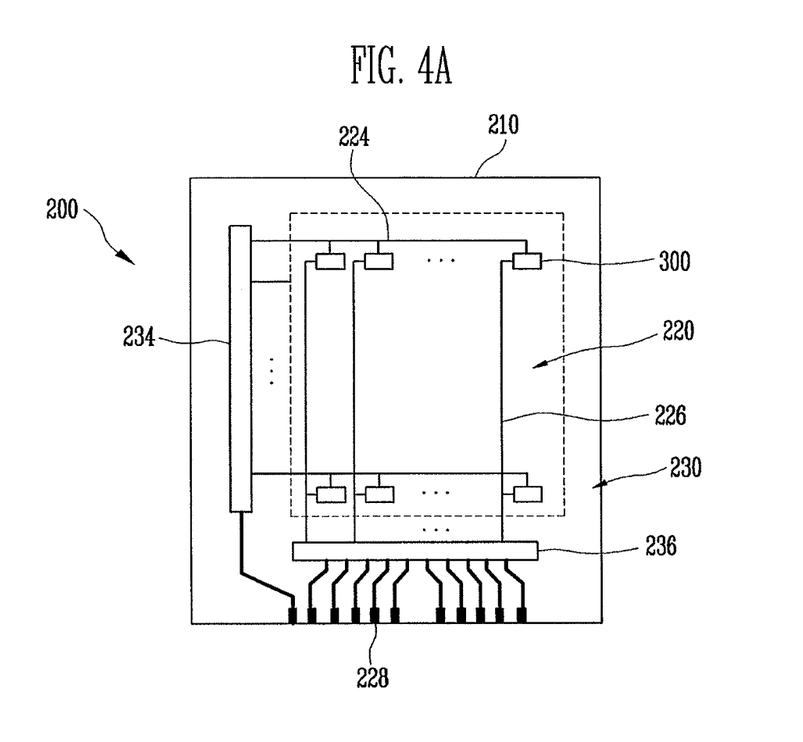
FIG. 4A and FIG. 4B illustrate plan and cross-sectional views, respectively, of a flat panel display according to a third embodiment.
Figure 4B:
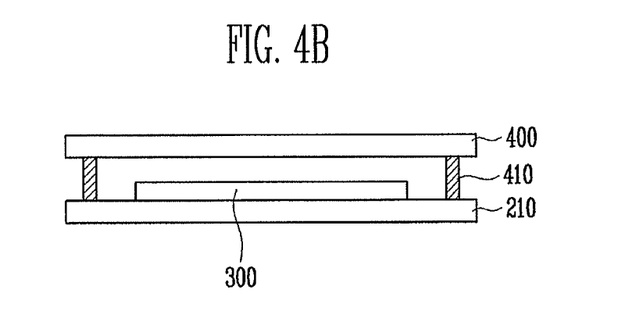

FIG. 4A and FIG. 4B illustrate plan and cross-sectional views, respectively, of a flat panel display according to a third embodiment, which includes a display panel 200 for displaying images as a main element. Referring to FIG. 4A, a substrate 210 may be have a pixel region 220 and a non-pixel region 230. The non-pixel region 230 may enclose, i.e., surround, the pixel region 220. A plurality of organic light emitting diodes (OLED's) 300 may be formed on the pixel region 220. The OLED's 300 may be coupled between scan lines 224 and data lines 226 in a matrix. Scan lines 224, data lines 226, and power supply lines (not shown) may be provided for operation of the OLED's 300. A scan driver 234 and a data driver 236 may be formed on the non-pixel region 230 of the substrate 210. The scan lines 224 and the data lines 226 may extend from the non-pixel region 230 to the pixel region 220. The scan driver 234 and the data driver 236 may process externally-provided signals, which may be provided via pads 228 and supply the processed signals to the scan lines 224 and the data lines 226.

Figure 5:
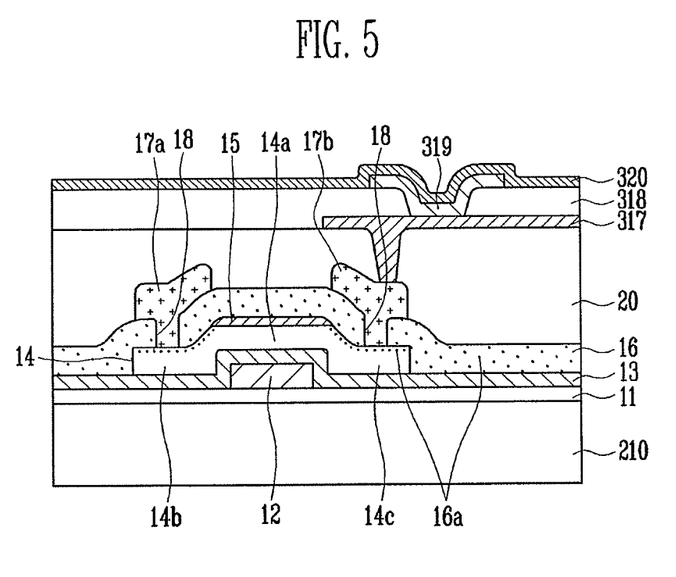
FIG. 5 illustrates an enlarged cross-sectional view of an organic light emitting diode of the flat panel display of FIG. 4A.

FIG. 5 illustrates an enlarged cross-sectional view of an organic light emitting diode of the flat panel display of FIG. 4A. Referring to FIG. 5, each OLED 300 may include an anode electrode 317, a cathode electrode 320, and an organic thin film layer 319. The organic thin film layer 319 may be formed between the anode electrode 317 and the cathode electrode 320. The organic thin film layer 319 may be formed of, e.g., a stacked structure having a hole transport layer, an organic emitting layer, and an electron transport layer. A hole injection layer and an electron injection layer may be included in the stacked structure of the organic thin film layer 319.

As illustrated in FIG. 5, a TFT according to the first embodiment may be formed in the pixel region 220 on the substrate 210 and may be coupled to the OLED 300 to control operation of the OLED 300. A capacitor (not shown) may be further provided, and may function to maintain signals. The TFT may be constructed as described above in connection with FIG. 1, and may be fabricated by the method described in connection with FIGS. 2A-2D. That is, as described above, the TFT may be formed on the substrate 210, which may be an insulating substrate. As described above, in an implementation, the buffer layer 11 may be provided under the TFT's. The TFT's may each include the gate electrode 12, the semiconductor layer 14, the hydrogen diffusion barrier layer 15, the interlayer dielectric layer 16, and the source and drain electrodes 17a and 17b. The gate electrode 12 may be formed on the insulating substrate 10. The semiconductor layer 14 may be insulated from the gate electrode 12 by the gate insulation layer 13, and may provide the channel region 14a, as well as the source and drain regions 14b and 14c. The hydrogen diffusion barrier layer 15 may be formed on the channel region 14a of the semiconductor layer 14. The interlayer dielectric layer 16 may contain hydrogen atoms 16a, and contact holes 18 may be formed in the interlayer dielectric layer 16 to expose the source and drain regions 14b and 14c. The source and drain electrodes 17a and 17b may be coupled to the source and drain regions 14b and 14c through the contact holes 18. The source and drain regions 14b and 14c may include hydrogen atoms 16a, which may be diffused from the interlayer dielectric layer 16.

Referring to FIGS. 4A and 5, the scan line 224 may be formed on the pixel region 220 to be coupled to the gate electrode 12. The data line 226 on the pixel region 220 may be coupled to one of the source and drain electrodes 17a and 17b. The pad 228 may be formed on the non-pixel region 230, and the data line 226 may extend from the pixel region 220 to the non-pixel region 230.

Referring to FIGS. 4A and 5, the OLED 300 may be coupled with the TFT having a structure as described above in connection with FIG. 1. In particular, referring to FIG. 5, a planarization layer 20 may be formed in order to provide a planar surface over the TFT. A via hole may be formed in the planarization layer 20 to expose a predetermined part of the source electrode 17a or the drain electrode 17b. The anode electrode 317 may be coupled to the source electrode 17a or the drain electrode 17b through the via hole. A pixel defining layer 318 may be formed on the planarization layer 20, and may have an opening that exposes part of the anode electrode 317, e.g., an emitting region. The organic thin film layer 319 may be formed on the exposed anode electrode 317. The cathode electrode 320 may be formed on the pixel defining layer 318 including the organic thin film layer 319.

With reference to FIG. 4B, a sealing substrate 400 for sealing the pixel region 220 may be arranged facing the substrate 210 on which the OLED 300 is formed. The sealing substrate 400 may be adhered to the substrate 210 by a sealant 410 to complete the display panel 200.

As described above, according to embodiments a hydrogen barrier layer may prevent hydrogen atoms contained in an interlayer dielectric layer from penetrating into a channel region while the hydrogen atoms are diffused into source and drain regions. Due to the diffusion of the hydrogen atoms, the resistivity of the source and drain regions may be reduced. However, since the hydrogen atoms may be substantially prevented from diffusing into the channel region, the resistivity of the channel region may not change, or may be changed by an insignificant amount. As a result, the resistivity of the source and drain regions may be reduced, while avoiding increases in leakage current in the channel region, Thus, a device containing the TFT may exhibit improved electrical characteristics.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a thin film transistor, comprising:
   forming a semiconductor layer having a portion overlying a gate electrode and having extending portions that extend laterally beyond the gate electrode, the gate electrode being insulated from the semiconductor layer;
   forming a hydrogen diffusion barrier layer on the portion of the semiconductor layer that overlies the gate electrode, the hydrogen diffusion barrier layer exposing the extending portions of the semiconductor layer;
   forming a hydrogen-containing layer on the portion of the semiconductor layer that overlies the gate electrode and on the extending portions of the semiconductor layer; and
   processing the hydrogen-containing layer to diffuse hydrogen from the hydrogen-containing layer into the extending portions of the semiconductor layer.

2. The method as claimed in claim 1, wherein:
   the hydrogen-containing layer is an insulating layer having contact holes that expose the extending portions of the semiconductor layer, and
   the contact holes are formed in the insulating layer after the insulating layer is processed to diffuse hydrogen into the extending portions of the semiconductor layer.

3. The method as claimed in claim 1, wherein processing the hydrogen-containing layer to diffuse hydrogen from the hydrogen-containing layer into the extending portions of the semiconductor layer results in a concentration of hydrogen atoms in the extending portions that is larger than a concentration of hydrogen atoms in the portion overlying the gate electrode.

4. The method as claimed in claim 3, wherein the semiconductor layer includes an oxygen-containing compound semiconductor.

5. The method as claimed in claim 1, wherein the hydrogen diffusion barrier layer includes one or more of a nitride, a carbide, or a ternary compound having a metal as a component thereof.

6. The method as claimed in claim 5, wherein the hydrogen diffusion barrier layer includes one or more of: titanium nitride, tantalum nitride, tungsten nitride, titanium carbide, tantalum carbide, a ternary compound of titanium, silicon, and nitrogen, a ternary compound of tantalum, silicon, and nitrogen, or a ternary compound of tungsten, boron, and nitrogen.

7. The method as claimed in claim 1, wherein processing the hydrogen-containing layer to diffuse hydrogen from the hydrogen-containing layer into the extending portions of the semiconductor layer includes heat treating.

8. The method as claimed in claim 1, wherein the hydrogen-containing layer is an insulating layer and the semiconductor layer includes an oxygen-containing compound semiconductor.

9. The method as claimed in claim 8, wherein the oxygen-containing compound semiconductor is zinc oxide.

10. The method as claimed in claim 8, wherein the oxygen-containing compound semiconductor includes zinc oxide doped with one or more of gallium, indium, or tin.

11. A method of manufacturing a thin film transistor, comprising:
    forming a semiconductor layer on a gate electrode and separated from the gate electrode by a first insulating layer, the semiconductor layer including a channel region corresponding to the gate electrode, a source region, and a drain region;
    a hydrogen diffusion barrier layer on the semiconductor layer, the hydrogen diffusion barrier layer covering the channel region and exposing the source and drain regions; and
    forming a hydrogen-containing layer on the source and drain regions and on the hydrogen diffusion barrier layer, such that the hydrogen diffusion barrier layer is between the hydrogen-containing layer and the channel region; and
    processing the hydrogen-containing layer to diffuse hydrogen from the hydrogen-containing layer into the source and drain regions.

12. The method as claimed in claim 11, wherein the hydrogen-containing layer is an insulating layer and the semiconductor layer includes an oxygen-containing compound semiconductor.

13. The method as claimed in claim 12, wherein the oxygen-containing compound semiconductor is zinc oxide.

14. The method as claimed in claim 12, wherein the oxygen-containing compound semiconductor includes zinc oxide doped with one or more of gallium, indium, or tin.

* * * * *